United States Patent
Fujiwara et al.

(10) Patent No.: US 8,487,720 B2
(45) Date of Patent: Jul. 16, 2013

(54) ACOUSTIC WAVE RESONATOR AND ACOUSTIC WAVE FILTER USING THE SAME

(75) Inventors: Joji Fujiwara, Osaka (JP); Tetsuya Tsurunari, Osaka (JP); Hiroyuki Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 309 days.

(21) Appl. No.: 13/037,640

(22) Filed: Mar. 1, 2011

(65) Prior Publication Data
US 2011/0215883 A1    Sep. 8, 2011

(30) Foreign Application Priority Data
Mar. 2, 2010  (JP) ................. 2010-045147

(51) Int. Cl.
  *H03H 9/64*  (2006.01)
  *H03H 9/145*  (2006.01)
  *H03H 9/25*  (2006.01)

(52) U.S. Cl.
  USPC ....... 333/195; 333/193; 333/196; 310/313 D; 310/313 A; 310/313 B; 310/313 C

(58) Field of Classification Search
  USPC .............. 333/193–196; 310/313 B, 313 D, 310/313 A, 313 C
  See application file for complete search history.

(56) References Cited

U.S. PATENT DOCUMENTS

| | | | | |
|---|---|---|---|---|
| 3,845,420 A | * | 10/1974 | Holland et al. | 333/153 |
| 4,081,769 A | * | 3/1978 | Shreve | 333/195 |
| 4,633,117 A | * | 12/1986 | Bloch et al. | 310/313 B |
| 4,912,356 A | * | 3/1990 | Mariani et al. | 310/313 C |
| 5,142,185 A | * | 8/1992 | Noel et al. | 310/313 B |
| 5,814,917 A | * | 9/1998 | Isobe et al. | 310/313 B |
| 5,895,996 A | * | 4/1999 | Takagi et al. | 310/313 R |
| 6,346,761 B1 | * | 2/2002 | Isobe et al. | 310/313 B |
| 7,352,104 B2 | * | 4/2008 | Yamazaki et al. | 310/313 A |
| 2003/0030513 A1 | * | 2/2003 | Yamazaki et al. | 333/195 |
| 2010/0164646 A1 | | 7/2010 | Nakanishi et al. | |
| 2010/0219905 A1 | * | 9/2010 | Nakamura et al. | 333/133 |

FOREIGN PATENT DOCUMENTS

| | | | |
|---|---|---|---|
| EP | 1 962 424 A1 | * | 8/2008 |
| JP | 2008-078981 A | | 4/2008 |
| WO | WO 2008/078573 A1 | * | 7/2008 |

* cited by examiner

*Primary Examiner* — Barbara Summons
(74) *Attorney, Agent, or Firm* — RatnerPrestia

(57) ABSTRACT

An acoustic wave resonator includes a piezoelectric substrate and first and second comb-shaped electrodes provided on the piezoelectric substrate and interdigitating with each other. The first comb-shaped electrode includes a first busbar and first electrode fingers extending in a direction non-perpendicular to a direction in which the first busbar extends. The second comb-shaped electrode includes a second busbar and second electrode fingers extending from the second busbar and interdigitating with the first electrode fingers at an interdigitating region. This acoustic wave resonator can suppress a spurious response due to a transverse mode and has a high Q value.

8 Claims, 8 Drawing Sheets

ACOUSTIC WAVE RESONATOR AND ACOUSTIC WAVE FILTER USING THE SAME

FIELD OF THE INVENTION

The present invention relates to an acoustic wave resonator that is used for a high-frequency device, such as a mobile phone or a wireless LAN terminal, and an acoustic wave filter using the acoustic wave resonator.

BACKGROUND OF THE INVENTION

FIG. 8 is a top view of conventional acoustic wave resonator 1 disclosed in Japanese Patent Unexamined Publication No. 2008-78981. Acoustic wave resonator 1 includes: piezoelectric substrate 2; busbar 3 provided on piezoelectric substrate 2; busbar 4 provided on piezoelectric substrate 2 to be parallel to busbar 3; electrode fingers 5 provided on piezoelectric substrate 2; and electrode fingers 6 provided on piezoelectric substrate 2. Electrode fingers 5 have respective one ends connected to busbar 3, and extend to busbar 4. Electrode fingers 6 have respective one ends connected to busbar 4, and extend to busbar 3 to interdigitate with electrode fingers 5. Busbars 3 and 4 extend in direction D11. Electrode fingers 5 and 6 extend in direction D12 perpendicular to direction D11.

FIG. 9 is a propagation characteristic chart of acoustic wave resonator 1. In FIG. 9, the horizontal axis represents a frequency, the left vertical axis represents attenuation, and the right vertical axis represents the attenuation at an enlarged scale. FIG. 9 shows propagation profiles 7 and 7E of acoustic wave resonator 1. The scale of the left vertical axis is applied to propagation profile 7. The enlarged scale of the right axis is applied to propagation profile 7E. Propagation profiles 7 and 7E of acoustic wave resonator 1 exhibit spurious response S11 caused by a transverse mode in the vicinity of a resonance frequency. Spurious response S11 causes the deterioration and decline of a Q value of acoustic wave resonator 1.

SUMMARY OF THE INVENTION

An acoustic wave resonator includes a piezoelectric substrate and first and second comb-shaped electrodes provided on the piezoelectric substrate and interdigitating with each other. The first comb-shaped electrode includes a first busbar and first electrode fingers extending in a direction non-perpendicular to a direction in which the first busbar extends. The second comb-shaped electrode includes a second busbar and second electrode fingers extending from the second busbar and interdigitating with the first electrode fingers at an interdigitating region.

This acoustic wave resonator can suppress a spurious response due to a transverse mode and has a high Q value.

DETAILED DESCRIPTION OF PREFERRED EMBODIMENT

Figure 1:
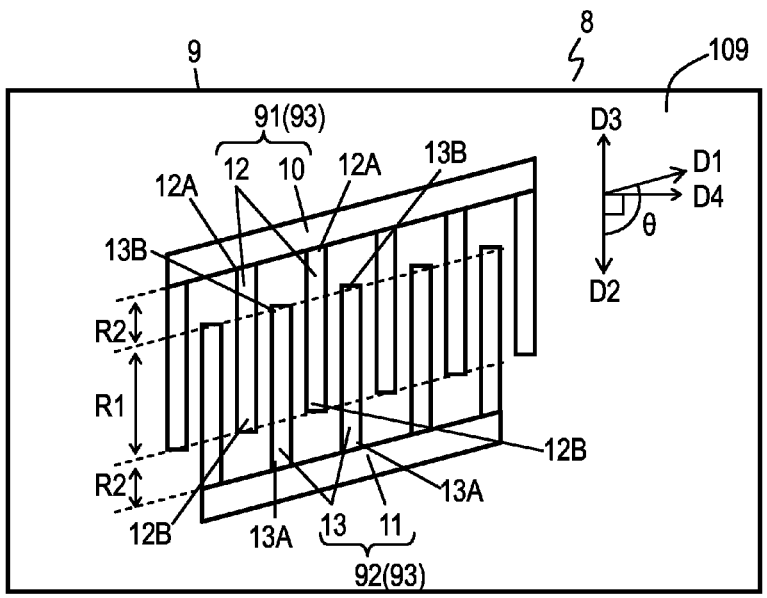
FIG. 1 is a top view of an acoustic wave resonator according to an exemplary embodiment of the present invention.

FIG. 1 is a top view of acoustic wave resonator 8 according to an exemplary embodiment. Acoustic wave resonator 8 includes: piezoelectric substrate 9; busbar 10 provided on upper surface 109 of piezoelectric substrate 9; busbar 11 provided on upper surface 109 of piezoelectric substrate 9; electrode fingers 12 provided on upper surface 109 of piezoelectric substrate 9; and electrode fingers 13 provided on upper surface 109 of piezoelectric substrate 9. Busbar 10 and electrode fingers 12 constitute comb-shaped electrode 91. Busbar 11 and electrode fingers 13 constitute comb-shaped electrode 92 that interdigitates with comb-shaped electrode 91 at interdigitating region R1. Comb-shaped electrodes 91 and 92 constitute interdigital transducer (IDT) electrode 93 that excites an acoustic wave.

Busbars 10 and 11 extend in parallel to each other along direction D1. Electrode fingers 12 have ends 12A connected to busbar 10 and ends 12B opposite to ends 12A, and extend to busbar 11 in parallel to each other in direction D2. Electrode fingers 13 have ends 13A connected to busbar 11 and ends 13B opposite to ends 13A, and extend to busbar 10 in parallel to each other in direction D3 opposite to direction D2. Direction D1 crosses direction D2 non-perpendicularly to direction D2. Directions D1 and D2 form angle θ that is not a right angle between directions D1 and D2. Electrode fingers 12 interdigitate with electrode fingers 13 at interdigitating region R1, and do not interdigitate with electrode fingers 13 at non-interdigitating region R2.

Piezoelectric substrate 9 is composed of a single-crystal piezoelectric substrate having a thickness of about 100 μm to 350 μm. Piezoelectric substrate 9 is, for example, a crystal, lithium tantalate, lithium niobate, or potassium niobate-base substrate. In this exemplary embodiment, piezoelectric substrate 9 is a lithium niobate-base substrate. This can increase an electromechanical coupling coefficient, thus providing a filter having a wide passband. By using a Y-cut X-propagation lithium niobate substrate in a range from −15° to +35° for piezoelectric substrate 9, acoustic wave resonator 8 can have a further-increased electromechanical coupling coefficient. In this exemplary embodiment, a 5° rotation Y-cut X-propagation lithium niobate substrate is used for piezoelectric substrate 9.

Each of busbars 10 and 11 and electrode fingers 12 and 13 is an electrode having a film thickness of about 0.1 to 0.5 μm. Busbars 10 and 11 and electrode fingers 12 and 13 have a structure obtained, for example, by layering a single metal composed of at least one of aluminum, copper, silver, gold, titanium, tungsten, platinum, chrome, nickel, and molybdenum, alloy including these metals as major components, or these metals. In this exemplary embodiment, busbars 10 and 11 as well as electrode fingers 12 and 13 are made of aluminum. Busbars 10 and 11 as well as electrode fingers 12 and 13 are formed on upper surface 109 of piezoelectric substrate 9 by sputtering or vapor deposition, for example.

In acoustic wave resonator 8, an acoustic wave is excited so as to propagate in direction D4 that is substantially perpendicular to directions D2 and D3 in which electrode fingers 12 and 13 extend. A transverse mode wave causing a spurious response is excited along direction D2. Direction D1 along which electrode fingers 12 and 13 are arranged so that direction D1 is non-perpendicular to direction D2, prevents standing waves along direction D1 of electrode fingers 12 and 13 from being coupled, thus suppressing transverse mode waves.

Figure 2:
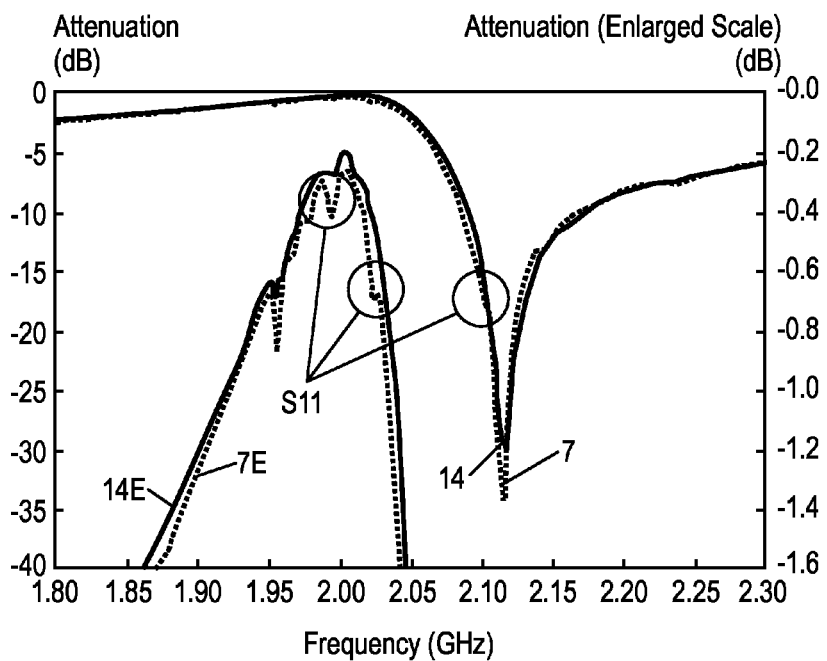
FIG. 2 is a propagation characteristic chart of the acoustic wave resonator according to the embodiment.
Figure 9:
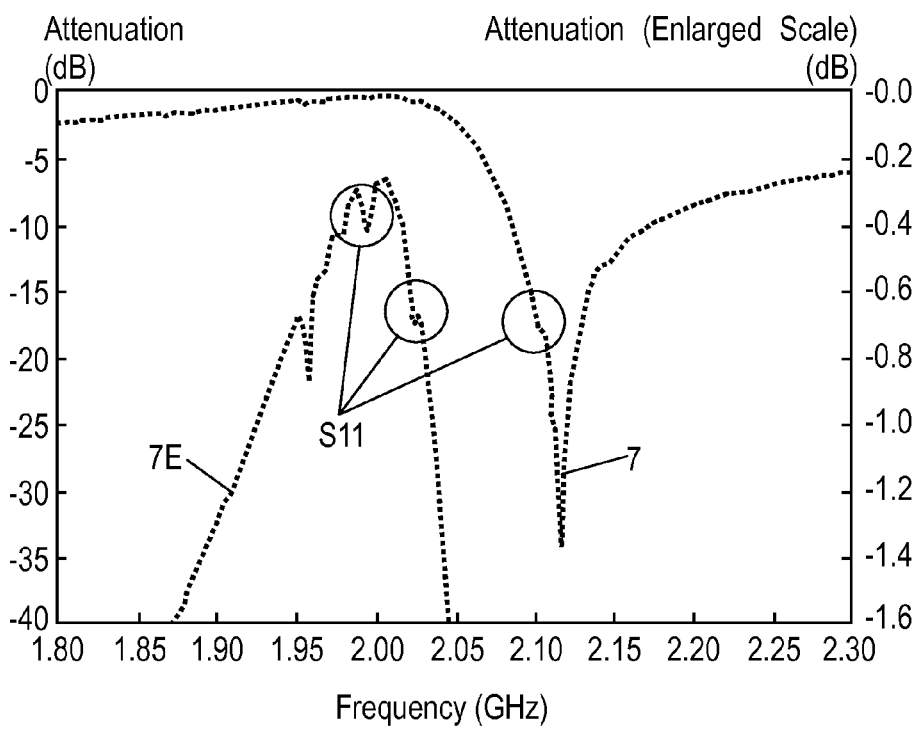
FIG. 9 is a propagation characteristic chart of the conventional acoustic wave resonator.

FIG. 2 is a propagation characteristic chart of acoustic wave resonator 8 upon angle θ being 98°. In FIG. 2, the horizontal axis represents a frequency, the left vertical axis represents attenuation, and the right vertical axis represents the attenuation at an enlarged scale. FIG. 2 shows propagation profiles 14 and 14E of acoustic wave resonator 8 according to the embodiment and propagation profiles 7 and 7E of conventional acoustic wave resonator 1 shown in FIG. 9. The scale of the left vertical axis is applied to propagation profiles 7 and 14. The enlarged scale of the right axis is applied to propagation profiles 7E and 14E. In propagation profiles 7 and 7E of conventional acoustic wave resonator 1 also shown in FIG. 9, spurious responses S11 occur in the vicinity of the resonance frequency. In propagation profiles 14 and 14E of acoustic wave resonator 8, on the other hand, these spurious responses are suppressed significantly. As described above, acoustic wave resonator 8 in this exemplary embodiment can significantly reduce a spurious response caused by a transverse mode, thus increasing the Q value.

Figure 3:
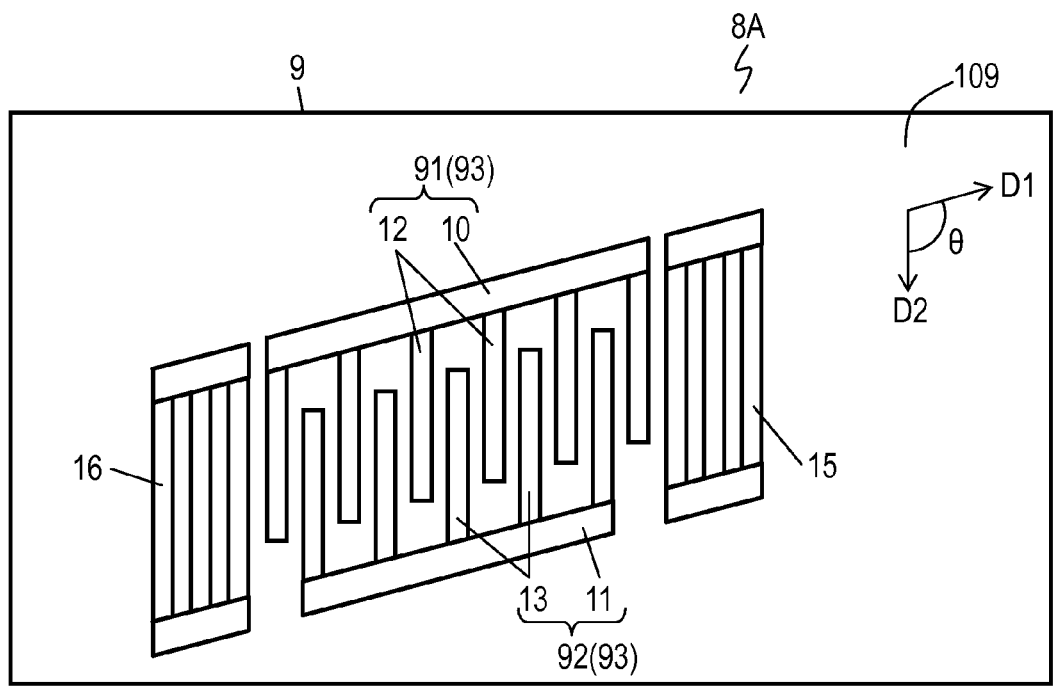
FIG. 3 is a top view of another acoustic wave resonator according to the embodiment.

FIG. 3 is a top view of another acoustic wave resonator 8A according to the embodiment. In FIG. 3, components identical to those of acoustic wave resonator 8 shown in FIG. 1 are denoted by the same reference numerals. Acoustic wave resonator 8A shown in FIG. 3 further includes reflectors 15 and 16 provided on upper surface 109 of piezoelectric substrate 9. Reflector 15 is adjacent to IDT electrode 93 in direction D1. Reflector 16 is adjacent to IDT electrode 93 in a direction opposite to direction D1. Reflectors 15 and 16 improve an effect for confining acoustic waves excited by IDT electrode 93 inside acoustic wave resonator 8A, thus increasing the Q value of acoustic wave resonator 8A.

Figure 4A:
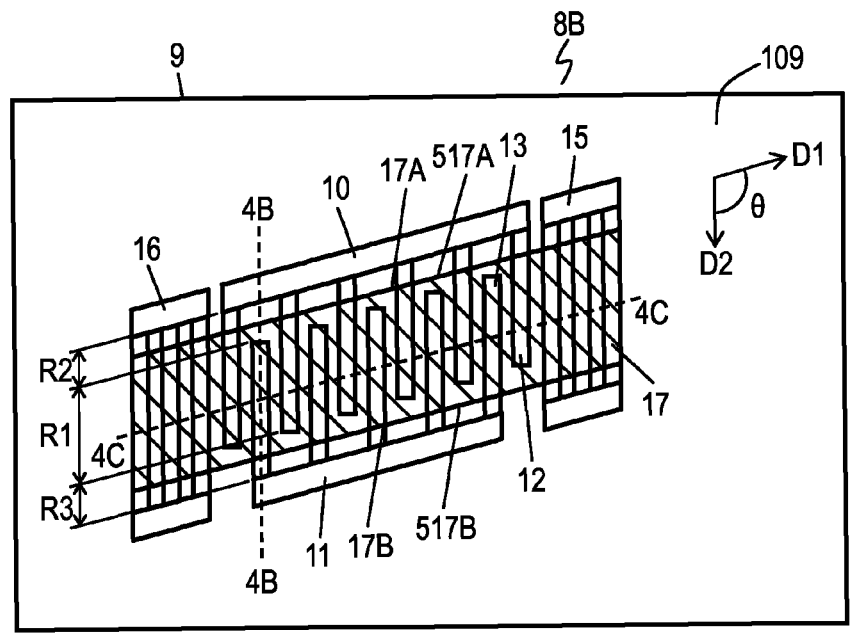
FIG. 4A is a top view of still another acoustic wave resonator according to the embodiment.
Figure 4B:
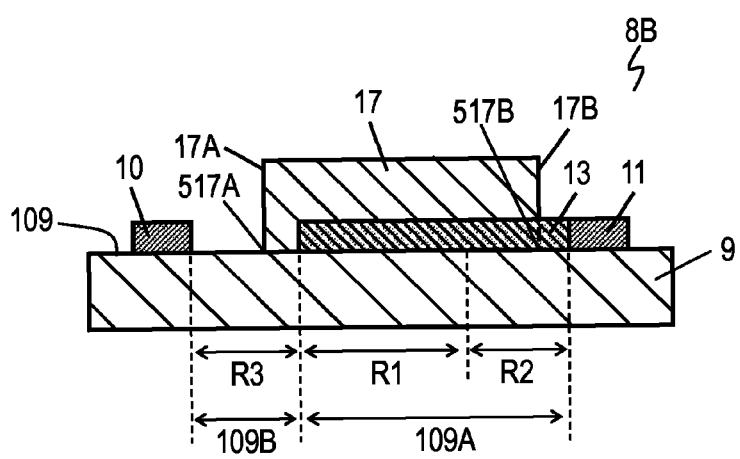
FIG. 4B is a cross sectional view of the acoustic resonator taken along line 4B-4B shown in FIG. 4A.

FIG. 4A is a top view of still another acoustic wave resonator 8B in the exemplary embodiment. FIG. 4B is a cross sectional view of acoustic wave resonator 8B taken along line 4B-4B shown in FIG. 4A. In FIG. 4A and FIG. 4B, components identical to those of acoustic wave resonator 8A shown in FIG. 3 are denoted by the same reference numerals. Acoustic wave resonator 8B shown in FIG. 4A and FIG. 4B further includes dielectric film 17 that is provided on upper surface 109 of piezoelectric substrate 9 and that covers electrode fingers 12 and electrode fingers 13. Dielectric film 17 contacts electrode fingers 12 and 13. Dielectric film 17 reduces a difference in the acoustic velocity of the acoustic wave between part 109A and part 109B of upper surface 109 of piezoelectric substrate 9. Part 109A has electrode fingers 12 and 13 thereon. Part 109B does not have electrode fingers 12 and 13 thereon. This structure can suppress a spurious response caused by unnecessary Rayleigh waves appearing in the vicinity of the resonance frequency of acoustic wave resonator 8B.

As shown in FIG. 4A, dielectric film 17 entirely covers interdigitating region R1 at which electrode fingers 12 interdigitate with electrode fingers 13. Dielectric film 17 does not necessarily cover a part of non-interdigitating region R2. This structure allows the acoustic velocity at non-interdigitating region R2 to be higher than the acoustic velocity at interdigitating region R1 to provide a difference between the acoustic velocity at non-interdigitating region R2 and the acoustic velocity at interdigitating region R1. Thus, a standing wave of a transverse mode wave can be prevented from occurring. The width of interdigitating region R1 may be identical to the width of dielectric film 17, that is, dielectric film 17 does not necessarily cover non-interdigitating region R2. This structure can maximize the suppression of a transverse mode. However, the effect of suppressing a transverse mode can be obtained even when dielectric film 17 covers not only interdigitating region R1 but also a part of non-interdigitating region R2 beyond interdigitating region R1.

Also as shown in FIG. 4A, dielectric film has surfaces 17A and 17B that face busbars 10 and 11 of dielectric film 17, respectively. Surfaces 17A and 17B has edges 517A and 517B situated on upper surface 109 of piezoelectric substrate 9, respectively. Edges 517A and 517B face busbars 10 and 11, respectively. Edges 517A is located in a gap between busbar 10 and each of respective tips of electrode fingers 13. Edges 517B is located in a gap between busbar 11 and each of respective tips of electrode fingers 12. This structure reduces undesired waves. Edges 517A and 517B extend straight in direction D1. Direction D1 crosses direction D2 at angle θ which is not a right angle, thus being non-perpendicular to direction D2 along which electrode fingers 12 and 13 extend. This configuration can prevents the transverse mode waves generated between busbar 10 and busbar 11 from being coupled to each other, thus suppressing transverse mode waves.

As shown in FIG. 4B, dielectric film 17 is provided on upper surface 109 of piezoelectric substrate 9 so as to cover interdigitating region R1. Electrode fingers 12 and 13 may have a film thickness smaller than the film thickness of dielectric film 17 to reduce a difference in the acoustic velocity of the acoustic wave between part 109A and part 109B of upper surface 109 of piezoelectric substrate 9. Part 109A has electrode fingers 12 and 13 thereon, and part 109B has none of electrode fingers 12 and 13 thereon. This can further improve the effect of suppressing a spurious response caused by an unnecessary Rayleigh wave appearing in the vicinity of the resonance frequency of acoustic wave resonator 8B.

Figure 4C:
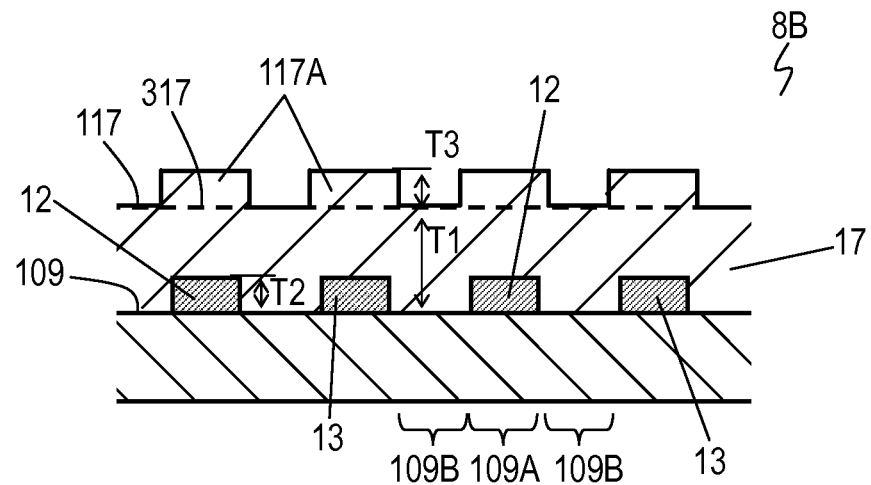
FIG. 4C is a cross sectional view of the acoustic resonator taken along line 4C-4C shown in FIG. 4A.

FIG. 4C is a cross sectional view of acoustic wave resonator 8B taken along line 4C-4C shown in FIG. 4A. Upper surface 117 of dielectric film 17 may have protrusions 117A located directly above electrode fingers 12 and 13. This can improve the design freedom of an acoustic velocity. Thus, part 109A having electrode fingers 12 and 13 thereon and part 109B having none of electrode fingers 12 and 13 thereon can have the same acoustic velocity while the thickness of dielectric film 17 is not increased. In this exemplary embodiment, normalized film thickness T2/λ that is a ratio of film thickness T2 of electrode fingers 12 and 13 to wavelength λ of an acoustic wave is about 8% (about 160 nm). Normalized film thickness T1/λ that is a ratio of film thickness T1 of dielectric film 17 to wavelength λ is about 20% (about 400 nm). Normalized film thickness T3/λ that is a ratio of film thickness T3 which is the height of protrusions 117A of upper surface 117 of dielectric film 17 to wavelength λ is about 8% (about 160 nm). These conditions suppress a spurious response caused by a Rayleigh mode effectively. Dielectric film 17 does not necessarily have upper surface 117 having protrusions 117A and may have flat upper surface 317.

Figure 4D:
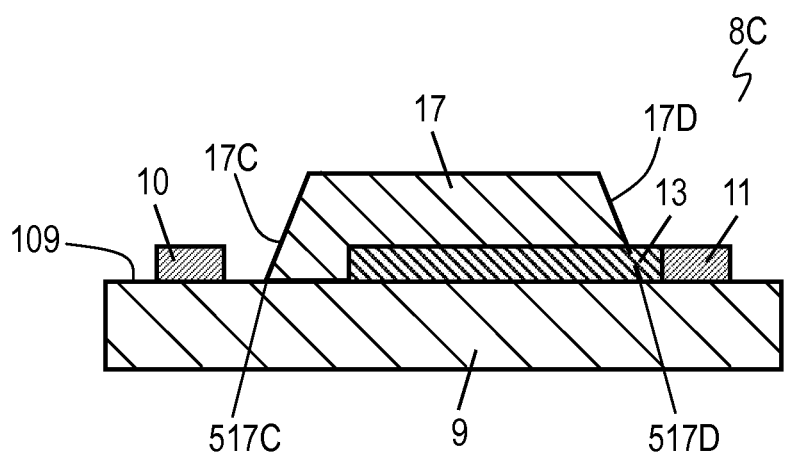
FIG. 4D is a cross sectional view of a further acoustic wave resonator according to the embodiment.

FIG. 4D is a cross sectional view of further acoustic wave resonator 8C in the exemplary embodiment. In FIG. 4D, components identical to those of acoustic wave resonator 8B shown in FIGS. 4A and 4B are denoted by the same reference numerals. Surfaces 17A and 17B that faces busbars 10 and 11 of dielectric film 17 of acoustic wave resonator 8B shown in FIG. 4B extend perpendicularly to upper surface 109 of piezoelectric substrate 9. In acoustic wave resonator 8C shown in FIG. 4D, dielectric film 17 has, instead of surfaces 17A and 17B, surfaces 17C and 17D facing busbars 10 and 11, respectively. Surfaces 17C and 17D have edges 517C and 517B which are situated on upper surface 109 and which face busbars 10 and 11, respectively. Surfaces 17C and 17D incline with respect to upper surface 109 in the height direction at edges 517C and 517B, respectively. Dielectric film 17 has a tapered shape that has a width decreasing as away from upper surface 109 of piezoelectric substrate 9. This shape can differentiate, in the height direction, the wavelength of standing wave of the transverse mode caused between busbar 10 and busbar 11. This can disperse the spurious responses caused by the transverse mode in an effective manner. Edge 517C is located in a gap provided between busbar 10 and each of respective tips of electrode fingers 13. Edge 517D is located in a gap provided between busbar 11 and each of respective tips of electrode fingers 12. This structure suppresses undesired waves. Edges 517C and 517D extend straight in direction D1 which crosses direction D2 at angle θ which is not a right angle. Electrode fingers 12 and 13 extend in direction D2.

Dielectric film 17 is preferably composed of a medium, such as silicon dioxide ($SiO_2$), that has a frequency-temperature characteristic opposite to that of piezoelectric substrate 9. As a result, acoustic wave resonators 8B and 8C can have an improved frequency-temperature characteristic. Dielectric film 17 is formed on upper surface 109 of piezoelectric substrate 9 by sputtering, vapor deposition, or CVD, for example, so as to cover at least interdigitating region R1 at which electrode fingers 12 interdigitate with electrode fingers 13.

Figure 5:
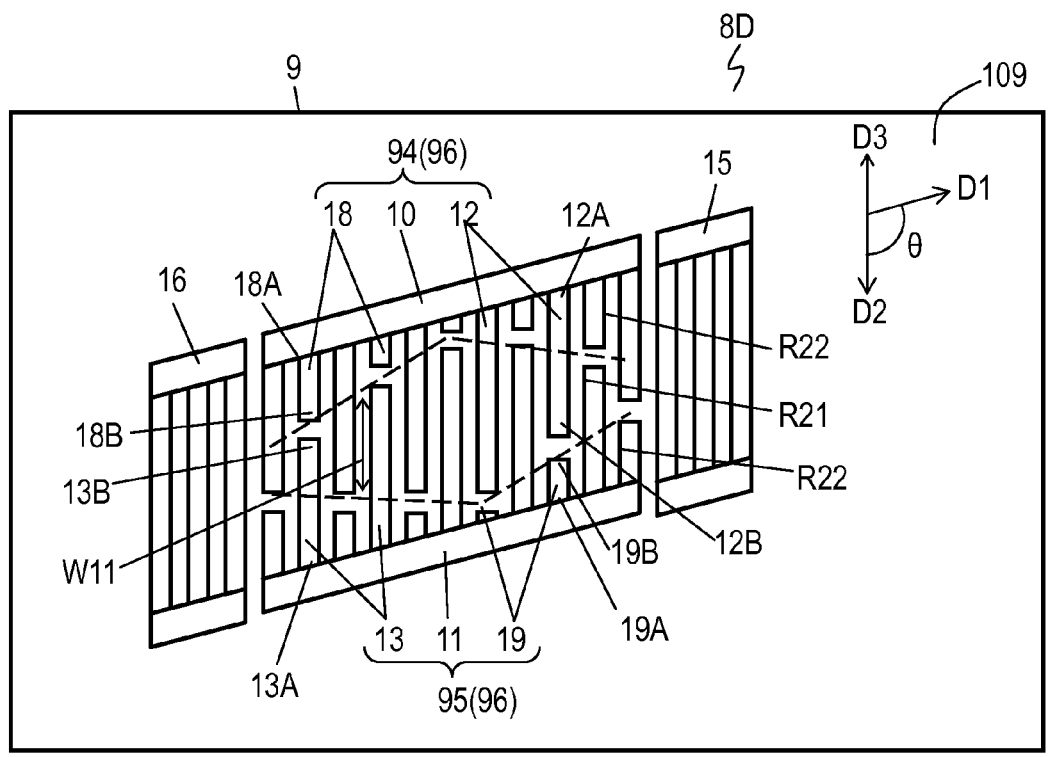
FIG. 5 is a top view of a further acoustic wave resonator according to the embodiment.

FIG. 5 is a top view of further acoustic wave resonator 8D in the exemplary embodiment. In FIG. 5, components identical to those of acoustic wave resonator 8A shown in FIG. 3 are denoted by the same reference numerals. Acoustic wave resonator 8D includes, instead of IDT electrode 93 of acoustic wave resonator 8A shown in FIG. 3, IDT electrode 96 provided on upper surface 109 of piezoelectric substrate 9. IDT electrode 96 further includes: dummy electrode fingers 18 that extend from busbar 10 to busbar 11 in direction D2 and that face electrode fingers 13, respectively; and dummy electrode fingers 19 that extend from busbar 11 to busbar 10 in direction D3 and that face electrode fingers 12, respectively. Electrode fingers 12 interdigitate with electrode fingers 13 at interdigitating region R21, and do not interdigitate with electrode fingers 13 at non-interdigitating region R22. Dummy electrode finger 18 extends collinearly to electrode finger 13. Dummy electrode finger 18 has end 18A connected to busbar 10 and end 18B opposite to end 18A. End 18B faces end 13B of electrode finger 13 in direction D2 (D3). Dummy electrode finger 19 extends collinearly to electrode finger 12. Dummy electrode finger 19 has end 19A connected to busbar 11 and end 19B opposite to end 19A. End 19B faces end 12B of electrode finger 12 in direction D2 (D3). This configuration allows non-interdigitating region R22 to have a acoustic velocity of an acoustic wave higher than the acoustic velocity at interdigitating region R21. As described above, the difference in the acoustic velocity between non-interdigitating region R22 and interdigitating region R21 can prevent a standing wave of a transverse mode wave from occurring at acoustic wave resonator 8D. Also as shown in FIG. 5, interdigitating width W11 in direction D2 (D3) along which electrode fingers 12 interdigitate with electrode fingers 13 changes along direction D1 along which busbars 10 and 11 extend, and the lengths of dummy electrode fingers 18 and 19 also change. In this exemplary embodiment, electrode fingers 12 and 13 have the longest length at the center of busbars 10 and 11 and have lengths decreasing as located away from the center of busbars 10 and 11. In contrast, dummy electrode fingers 18 and 19 have the shortest length at the center of busbars 10 and 11 and have lengths increasing as located away from the center of busbars 10 and 11. As a result, interdigitating width W11 is longest at the center of busbars 10 and 11 and is shorter as away from the center of busbars 10 and 11. This configuration can disperse the frequencies at which electrode fingers 12 and 13 have a standing wave along direction D1, thus suppressing a transverse mode wave.

Figure 6:
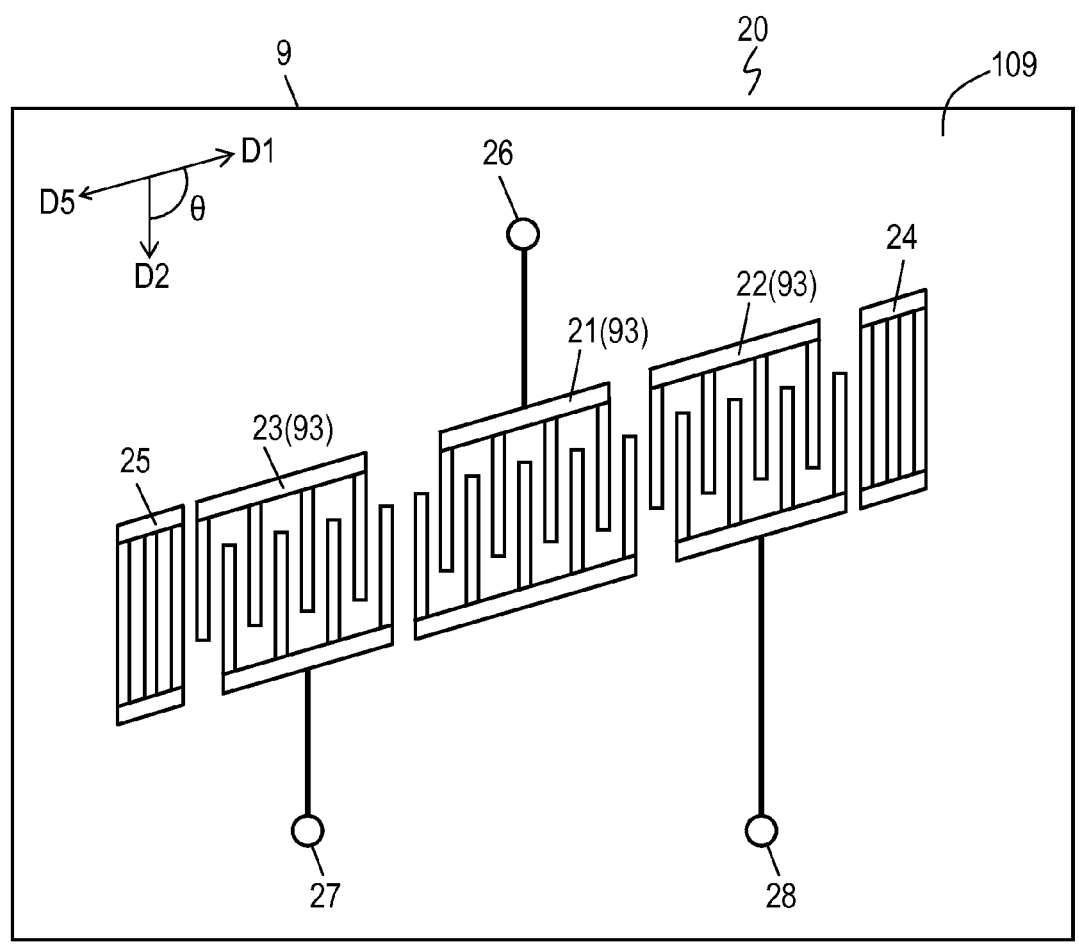
FIG. 6 is a top view of an acoustic wave filter according to the embodiment.

FIG. 6 is a top view of acoustic wave filter 20 including acoustic wave resonator 8 (8A to 8D) in this exemplary embodiment. Acoustic wave filter 20 is a longitudinally coupled double mode filter. In FIG. 6, components identical to those of acoustic wave resonator 8 (8A to 8D) shown in FIG. 1 to FIG. 5 are denoted by the same reference numerals. Acoustic wave filter 20 includes: acoustic wave resonators 21 to 23 provided on upper surface 109 of piezoelectric substrate 9; and reflectors 24 and 25 provided on upper surface 109 of piezoelectric substrate 9. Acoustic wave resonators 21 to 23 are coupled to one another. At least one of acoustic wave resonator 21 to 23 is acoustic wave resonator 8 shown in FIG. 1. In acoustic wave filter 20 shown in FIG. 6, all of acoustic wave resonators 21 to 23 are acoustic wave resonator 8. Each of acoustic wave resonators 21 to 23 includes busbars extending in direction D1 and electrode fingers extending in directions D2 and D3 so as to interdigitate with one another. Acoustic wave resonators 21 to 23 and reflectors 24 and 25 are arranged in direction D1. Specifically, acoustic wave resonator 22 is positioned from acoustic wave resonator 21 in direction D1 and is adjacent to acoustic wave resonator 21. Reflector 24 is positioned from acoustic wave resonator 22 in direction D1 and is adjacent to acoustic wave resonator 22. Acoustic wave resonator 23 is positioned from acoustic wave resonator 21 in direction D5 opposite to direction D1 and is adjacent to acoustic wave resonator 23. Reflector 25 is positioned from acoustic wave resonator 23 in direction D5 and is adjacent to acoustic wave resonator 22. Acoustic wave resonator 21 provided at the center of acoustic wave resonators 21 to 23 is connected to unbalanced terminal 26. Acoustic wave resonators 22 and 23 provided at both sides of acoustic wave resonator 21 are connected to balanced terminals 27 and 28, respectively.

Acoustic wave filter 20 as a longitudinally coupled double mode filter including acoustic wave resonators 8 (8A to 8D) in this exemplary embodiment suppresses a spurious response caused by a transverse mode can be suppressed, thus improving the insertion loss of the longitudinally coupled double mode filter.

In FIG. 6, the direction in which the busbars extend is non-perpendicular to the direction in which the electrode fingers extend in all of acoustic wave resonators 21 to 23. However, the direction in which the busbars extend may be non-perpendicular to the direction in which the electrode fingers extend in one of acoustic wave resonators 21 to 23, still suppressing a spurious response caused by a transverse mode.

Alternatively, an angle formed between a direction along which the busbars extend and a direction along which the electrode fingers extend in acoustic wave resonator 21 may be different from an angle formed between a direction along which the busbars extend and a direction along which the electrode fingers extend in acoustic wave resonators 22 and 23.

Figure 7:
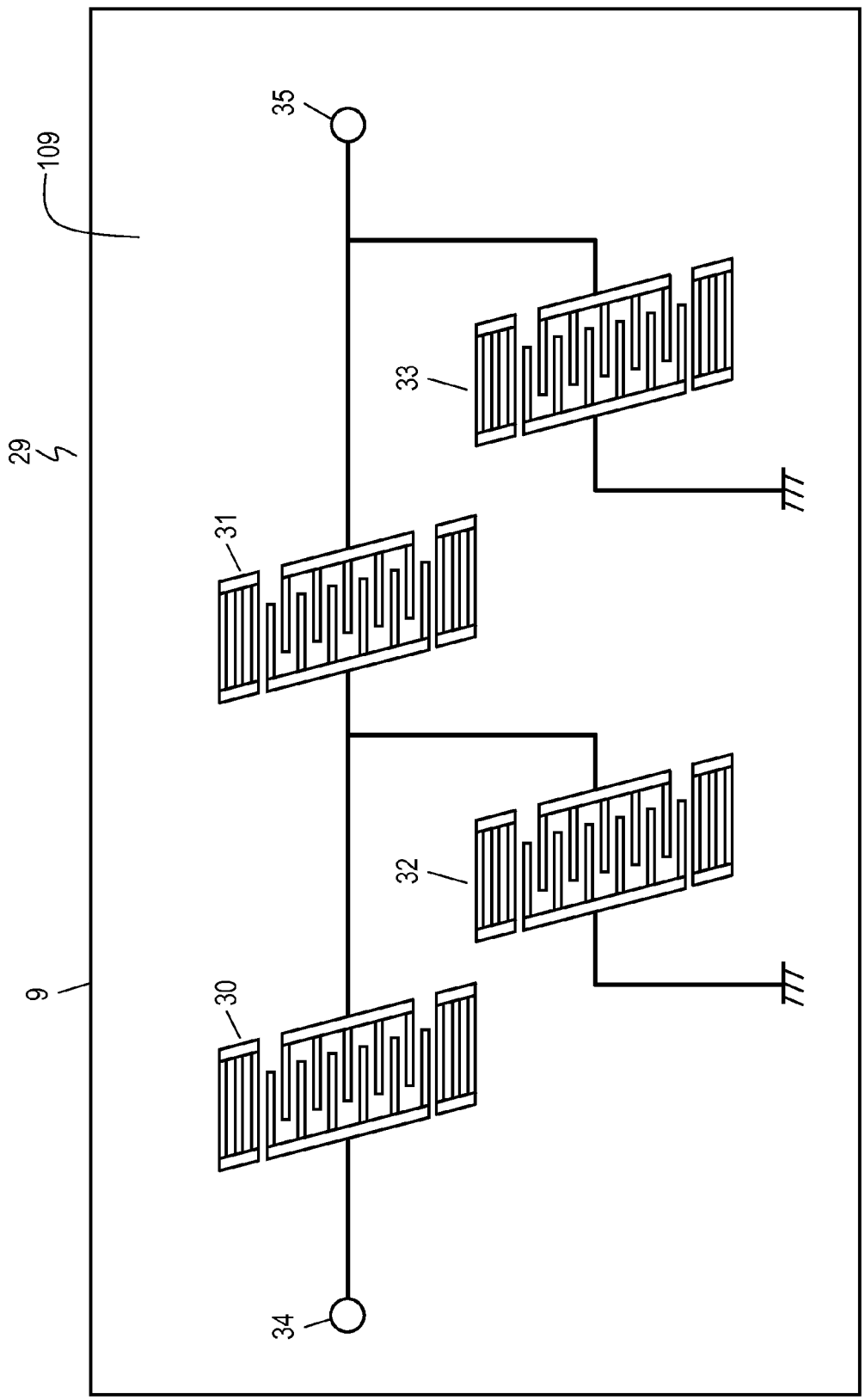
FIG. 7 is a top view of another acoustic wave filter according to the embodiment.
Figure 8:
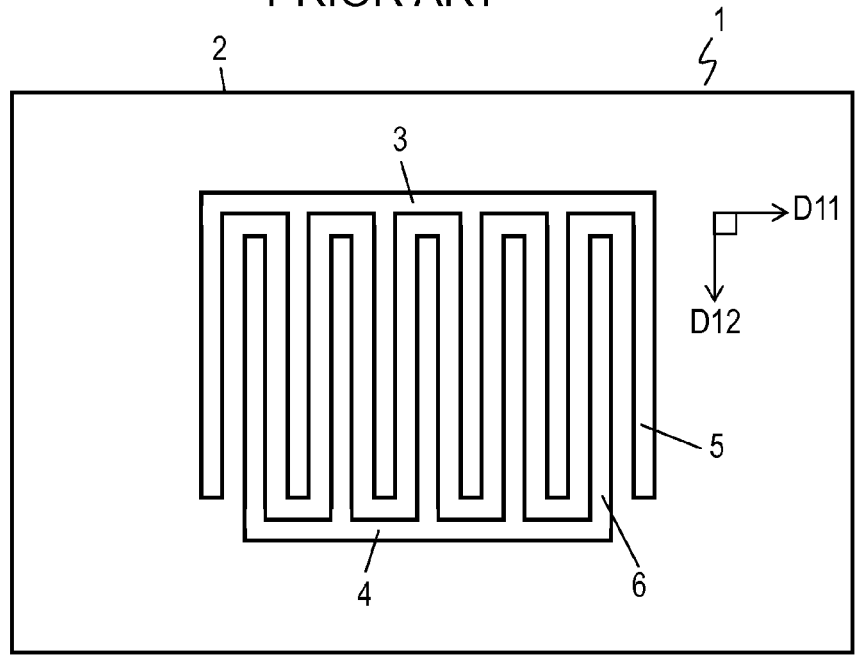
FIG. 8 is a top view of a conventional acoustic wave resonator.

FIG. 7 is a top view of another acoustic wave filter 29 in this exemplary embodiment. Acoustic wave filter 29 is a ladder-type filter. In FIG. 7, components identical to those of acoustic wave resonator 8 (8A to 8D) shown in FIG. 1 to FIG. 5 are denoted by the same reference numerals. Acoustic wave filter 29 includes acoustic wave resonators 30 to 33 provided on upper surface 109 of piezoelectric substrate 9. Acoustic wave resonators 30 to 33 are connected in a ladder shape. Acoustic wave resonators 30 and 31 are connected in serial arms. Acoustic wave resonators 32 and 33 are connected in parallel arms. Acoustic wave resonator 30 is connected to terminal 34. Acoustic wave resonator 31 is connected to terminal 35.

Acoustic wave filter 29 includes, as in acoustic wave filter 20 shown in FIG. 6, acoustic wave resonator 8 (8A to 8D) for at least one of acoustic wave resonators 30 to 33. This can suppress a spurious response caused by a transverse mode, thus improving the insertion loss of the ladder-type filter.

All of acoustic wave resonators 30 to 33 are structured so that the busbars extend in the direction non-perpendicular to the direction along which the electrode fingers extend. However, a spurious response caused by a transverse mode also can be suppressed by another configuration in which at least one of acoustic wave resonators 30 to 33 are structured so that the busbars extend in the direction non-perpendicular to the direction along which the electrode fingers extend and the other resonators are structured so that the busbars extend in the direction perpendicular to the direction along which the electrode fingers extend.

An angle formed between a direction along which the busbars extend and the direction along which the electrode fingers extend in acoustic wave resonator 30 may be different from an angle formed between a direction along which the busbars extend and a direction along which the electrode fingers extend in acoustic wave resonator 31.

Acoustic wave resonator 8 (8A to 8D) in the exemplary embodiment can suppress a spurious response caused by a transverse mode and can increase the Q value of the acoustic wave resonator. Thus, the acoustic wave resonator is useful for a high-frequency device such as a mobile phone or a wireless LAN terminal.

According to the exemplary embodiment, terms, such as "upper surface", "above", and "directly above", indicating directions just indicate relative directions depending only on the positional relation of components, such as the piezoelectric substrate and the IDT electrode, of the acoustic wave resonators, and do not indicate absolute directions, such as a vertical direction.

What is claimed is:

1. An acoustic wave resonator comprising:
   a piezoelectric substrate having an upper surface;
   an interdigital transducer (IDT) electrode that includes a first comb-shaped electrode provided on the upper surface of the piezoelectric substrate and a second comb-shaped electrode provided on the upper surface of the piezoelectric substrate, the second comb-shaped electrode interdigitating with the first comb-shaped electrode; and
   a dielectric film that is provided on the upper surface of the piezoelectric substrate to cover the IDT electrode,
   wherein the first comb-shaped electrode includes:
      a first busbar provided on the upper surface of the piezoelectric substrate to extend in a first direction; and
      a plurality of first electrode fingers that are provided on the upper surface of the piezoelectric substrate and that extend from the first busbar in a second direction non-perpendicular to the first direction,
   the second comb-shaped electrode includes:
      a second busbar provided on the upper surface of the piezoelectric substrate to extend in the first direction; and
      a plurality of second electrode fingers that are provided on the upper surface of the piezoelectric substrate and that extend from the second busbar in a third direction opposite to the second direction, the plurality of second electrode fingers interdigitating with the plurality of first electrode fingers at an interdigitating region, and
   a surface of the dielectric film inclines with respect to the upper surface of the piezoelectric substrate at an edge of the dielectric film.

2. The acoustic wave resonator according to claim 1, wherein the dielectric film is provided on the upper surface of the piezoelectric substrate to cover the IDT electrode at the interdigitating region,
   wherein the dielectric film has an edge facing the first busbar, and
   wherein the edge of the dielectric film extends straight.

3. The acoustic wave resonator according to claim 1, further comprising:
   a first reflector that is adjacent to the IDT electrode in the first direction; and
   a second reflector that is adjacent to the IDT electrode in a direction opposite to the first direction.

4. The acoustic wave resonator according to claim 1, wherein the piezoelectric substrate is made of lithium niobate.

5. The acoustic wave resonator according to claim 1, wherein the piezoelectric substrate is a −15° to +35° rotation Y-cut X-propagation lithium niobate substrate.

6. An acoustic wave filter comprising
   a plurality of acoustic wave resonators coupled to each other,
   wherein at least one of the plurality of acoustic wave resonators comprises the acoustic wave resonator according to claim 1.

7. The acoustic wave filter according to claim 6, further comprising
   a plurality of reflectors provided at both ends of the plurality of acoustic wave resonators,
   wherein the plurality of acoustic wave resonators and the plurality of reflectors are provided on the upper surface of the piezoelectric substrate.

8. The acoustic wave filter according to claim 6, wherein the plurality of acoustic wave resonators are connected in a ladder shape.

* * * * *